United States Patent [19]

Maunders

[11] Patent Number: 4,827,866

[45] Date of Patent: May 9, 1989

[54] METHOD AND APPARATUS FOR TREATING AN ARTICLE IN A HEATED ENVIRONMENT

[75] Inventor: Ernest A. Maunders, Huntington Beach, Calif.

[73] Assignee: Northrop Corporation, Hawthorne, Calif.

[21] Appl. No.: 186,765

[22] Filed: Apr. 22, 1988

Related U.S. Application Data

[63] Continuation of Ser. No. 832,834, Feb. 24, 1986, abandoned.

[51] Int. Cl.$^4$ .................. C23C 14/00; C23F 1/00; B05C 3/02
[52] U.S. Cl. ................................. 118/50; 118/421; 118/429; 156/345; 422/129
[58] Field of Search ................... 118/50, 421, 429; 156/345; 422/129; 134/93; 220/20.5, 4 C

[56] References Cited

U.S. PATENT DOCUMENTS

| | | | |
|---|---|---|---|
| 111,784 | 3/1871 | Smith | 118/50 |
| 621,601 | 3/1899 | Conley | 220/4 C |
| 1,972,771 | 9/1934 | Haid | 220/20.5 X |
| 1,974,918 | 9/1934 | Hanson | 118/421 |
| 2,445,275 | 7/1948 | Lintern | 220/20.5 X |
| 3,133,881 | 5/1964 | Childs | 220/20.5 X |
| 3,639,152 | 2/1972 | Bodine | 118/429 |
| 3,843,142 | 10/1974 | Lopata | 118/50 X |
| 4,267,794 | 5/1981 | Hartmann | 118/421 X |
| 4,442,338 | 4/1984 | Yamazaki | 156/345 X |

OTHER PUBLICATIONS

Schaar & Company; Selected Laboratory Equipment Catalog No. 50; Schaar & Company, 754 W. Lexington St. Chic. Ill.; 1950; Bottles, Weighing p. 91.

*Primary Examiner*—Kenneth M. Schor
*Attorney, Agent, or Firm*—Terry J. Anderson; Robert B. Block

[57] ABSTRACT

The invention includes a method with the steps of confining a substance which will, upon heating, produce the liquid treating composition and corrosive vapor in a first compartment and confining an article to be treated by the liquid treating composition in a second compartment until both are heated to the designated treating temperature. The treating liquid is then introduced into the compartment containing the article to be treated. In this matter, the corrosive vapors do not come into contact with the article to be treated until the article is immersed in the treating liquid. The apparatus according to the invention includes a unitary structure including a first compartment adapted to contain a substance which will produce the treating liquid upon heating as well as the corrosive vapor simultaneously therewith, and a second compartment adapted to hold the article to be treated and including a means for positioning the article in said second compartment. Valve means connected between the first and second compartments permit the release of the treating liquid into the second compartment after the simultaneous heating of both compartments.

3 Claims, 1 Drawing Sheet

METHOD AND APPARATUS FOR TREATING AN ARTICLE IN A HEATED ENVIRONMENT

This is a continuation of co-pending application Ser. No. 832,834 filed on Feb. 24, 1986 now abandoned.

SUMMARY OF THE INVENTION

In certain procedures for treating articles with molten treating composition the molten material is obtained by heating such material, in its solid form, together with the article in a confined space. Problems have resulted from the presence of corrosive fumes or vapors which are produced from the solid composition as it is being heated. An example of such a process is the treatment of delicate precision photolithographs with molten benzoic acid to form waveguides, wherein the fumes from the benzoic acid crystals can seriously damage the photo mask materials.

According to this invention, a method and apparatus have been developed whereby an article can be treated in a heated environment with a liquid treating composition wherein the liquid treating composition is produced by heating a solid substance which also produces a corrosive vapor upon heating. The foregoing problem in the prior art is avoided by maintaining the corrosive vapor apart from the article to be treated until the liquid treating composition comes into contact with the article which is immersed therein.

In its method aspect, the invention includes the steps of confining the substance which will, upon heating, produce the liquid treating composition and corrosive vapor in a first compartment and confining the article to be treated by the liquid treating composition in a second compartment until both are heated to the designated treating temperature. The treating liquid is then introduced into the compartment containing the article to be treated and the article is immersed in the liquid for the treating period. In this manner, the corrosive vapors do not come into contact with the article to be treated until the article is immersed in the treating liquid.

The apparatus according to the invention includes a unitary structure including a first compartment adapted to contain a substance which will produce the treating liquid upon heating as well as the corrosive vapor simultaneously therewith, and a second compartment adapted to hold the article to be treated and including a means for positioning the article in said second compartment. Valve means connected between the first and second compartments permit the release of the treating liquid into the second compartment after the simultaneous heating of both compartments. A second valve means on either the first or second compartment allows evacuation of both compartments to permit expansion of the vapor from the solid substance.

In a preferred apparatus form of the invention, 0-ring joints are provided between the first and second compartments respectively and the valve means connected therebetween. In a further preferred form of the invention, the respective commecting means of the first and second compartments and the valve means are outwardly flared, at least on the external surface, to permit clamping of the components together by means of peripheral collars on the respective outwardly flared portions which can be joined together to form a clamp for the components of the treating apparatus.

It is an object of this invention to provide a method and apparatus for the treatment of an article in a heated environment whereby corrosive and otherwise deleterious vapors can be maintained separate from the article during heating.

A further object of this invention was to provide an apparatus of the foregoing type which is reusable and can be formed of heat resistant glass materials.

Yet a further object of this invention is a provision and article of the foregoing type which can utilize greaseless connections and will be leakfree and vacuum tight.

These and other objects of the invention will be apparent from the following detailed description of the invention and the accompanying drawing.

DESCRIPTION OF THE DRAWINGS

The invention will be more fully understood with reference to the drawing wherein.

DETAILED DESCRIPTION OF THE INVENTION

Figure 1:
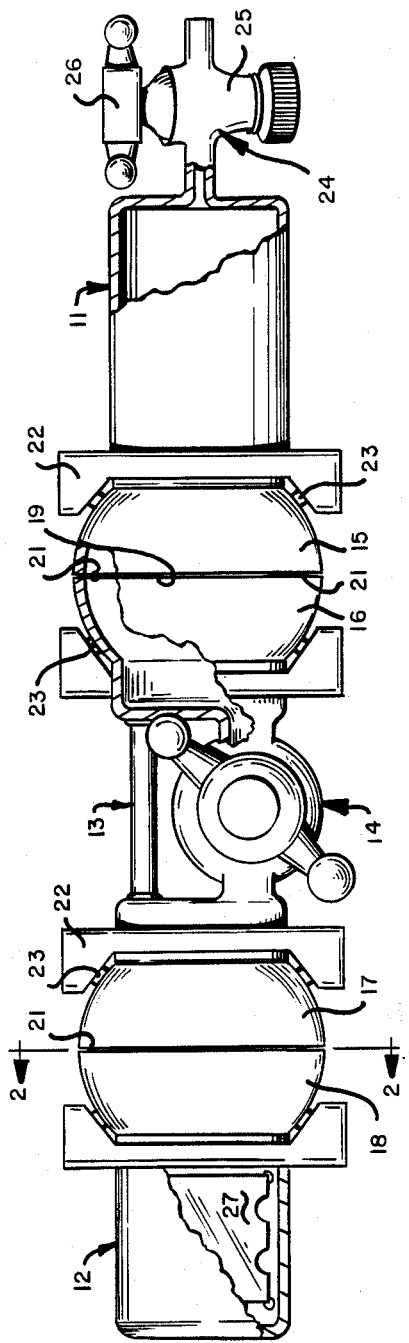
FIG. 1 is a plan view of the apparatus according to the invention with sections thereof broken away for convenience of illustration.
Figure 4:
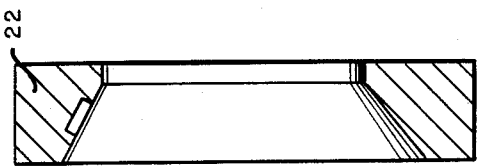
FIG. 4 is a view in cross-section of a clamping ring shown as part of the apparatus in FIG. 1.
Figure 3:
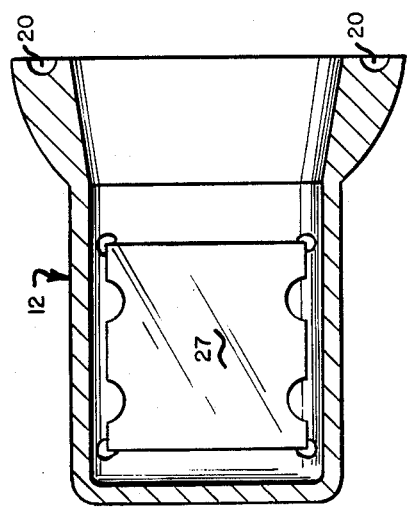
FIG. 3 is a cross-sectional view taken on Line 3—3 of FIG. 2.
Figure 2:
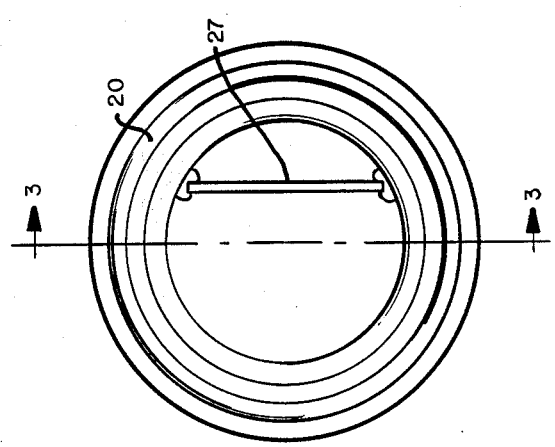
FIG. 2 is an end view of a component of the apparatus of the invention taken on Line 2—2 of FIG. 1.

Referring now to the drawings, and particularly to FIG. 1, there is shown therein an apparatus for treating an article to be heated. The apparatus comprises a first compartment 11 and a second compartment 12. An intermediate compartment joining means 13 is placed between the first and second compartments 11 and 12 respectively. The compartment joining unit 13 also includes a valve 14 adapted to establish communication between first compartment 11 and second compartment 12. Outwardly flared flanges 15, 16, 17 and 18 are provided to form joints between first compartment 11, intermediate joining means 13 and second compartment 12 respectively. The respective faces 19 of joints 15, 16, 17 and 18 include O-ring grooves 20 which are adapted to provide seats for O-rings 21. Clamping rings 22 are provided which extend circumferentially around the respective units 11, 12 and 13 and conform to the outwardly flared contours of joints 15, 16, 17 and 18. Cushioning plugs 23, preferably of polytetrafluoroethylene sold under the brand name TEFLON, are provided as inserts to clamping ring 22 to provide contact with outwardly flared joints 15, 16, 17 and 18. Clamping rings 22 can be fastened together by means not shown such as "C" clamps or bolts extending through the clamping rings and fastened with the aid of nuts.

A second valve 24 is provided in communication with compartment 11. Both valves 14 and 24 can be standard stopcock valves which can be rotated to provide communication between compartments 11 and 12, with respect to valve 14 and communication with the atmosphere, with respect to valve 24. As best shown in connection with valve 24, the valve includes a valve seat 25 and a stopcock 26 which can be rotated.

As a means for positioning an article to be treated in compartment 12, a shelf 27 is provided. The article to e treated can be secured to the shelf.

In a preferred form of the invention, all of the foregoing described components except the O-ring 21, clamping rings 22 and plugs 23 can be formed of pyrex glass or similar material able to withstand temperatures of 200°–300° C. The O-rings are preferably rubber and clamping rings 22 are preferably aluminum.

In a currently preferred utilization of the above described apparatus in accordance with the method of the invention, optical waveguides can be formed in LiNbO₃ substrates by proton exchange in benzoic acid melts. The proton exchange, which results in the replacement of lithium ions with protons, takes place when the article to be treated, a LiNbO₃ substrate, is immersed in molten benzoic acid.

In accordance with the preferred method of the invention, a measured amount of benzoic acid crystals is placed in compartment 11 which is then joined to joining unit 13 by means of O-rings 21 and clamping rings 22. An aluminum masked LiNbO₃ substrate is placed in second compartment 12 on shelf 27 and secured thereto. Compartment 12 is joined to joining unit 13 by means of O-rings 21 and clamping rings 22. The stopcocks of valves 14 and 24 are opened and the entire unitary assembly is evacuated to provide for expansion of vapor from the benzoic acid crystals. The stopcocks of valves 14 and 24 are then closed and the entire assembly is heated as a unit in a furnace to reach a predetermined temperature which will result in the melting of the benzoic acid crystals and provide the proper treating temperature of the LiNbO₃ substrate. At this point, the assembly is removed as a unit from the oven and the stopcock of valve 14 opened to allow the molten benzoic acid to flow from compartment 11 through compartment joining means to compartment 12. It will be appreciated that the LiNbO₃ substrate in compartment 12 has been protected from the corrosive vapors of the benzoic acid crystals during heating. Sufficient benzoic acid crystals are used and sufficient molten benzoic acid is introduced into compartment 12 to immerse the sample in the liquid which will not attack, in its liquid form, the masking materials for the LiNbO₃ substrate. On the other hand, benzoic acid vapor is known to attack such masking materials. The assembly is then replaced in the oven to chemically modify the LiNbO₃ substrate by proton exchange for a prescribed period of time. At the end of this time the assembly is removed from the oven and rotated 180° lifting the sample on shelf 27 clear of the benzoic acid liquid. The sample is then permitted to cool.

Preferred temperature ranges for the foregoing process, for melting the benzoic acid crystals and treating the LiNbO₃ substrate are in the range of 200° C. to 300° C.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description; and all changes which come within the meaning and range of equivalency of the claims are therefore intended to be embraced therein.

What is claimed is:

1. Treatment apparatus structured for heating a composition and an article to be treated to a treatment temperature in isolation from each other in a vacuum, said composition forming a treatment liquid which treats said article and a corrosive vapour at he treatment temperature, and for thereafter contacting the treatment liquid so formed with the article to treat the same to modify its properties, said treatment apparatus comprising:

a first vessel having an outlet;
a shelf positioned in said first vessel for defining the position of the article to be treated;
a first vacuum tight valve including an inlet and an outlet;
joining means for connecting said valve outlet and said first vessel outlet in fluid flow communication and including means providing a vacuum tight seal disposed therebetween;
a second vessel for receiving said treating composition and having an outlet;
joining means for connecting said first valve inlet in fluid flow communication to the second vessel outlet and including means providing a vacuum tight seal disposed therebetween;
a second vacuum tight valve connected to said second vessel;
said first and second connecting means each including a detachable clamping means for securing said first valve, and said first and second vessels into a self-supporting unitary vacuum tight assembly for placement in an oven and for manipulation by an operator;
said vessels, said connecting means including said clamping means and vacuum tight sealing means, and said valves being made of materials which are resistant to corrosion by said treating substance, in molten liquid form, and to its vapour, when heated;
the apparatus being structured such that:
(a) said first and second vessels, when said first and second valves are opened, permitting evacuation of said assembly which evacuation is maintained by closing said second valve,
(b) said first and second vessels being isolated from fluid or vapour communication by temporarily closing said first valve, after evacuation, and
(c) said assembly thereafter being heatable to melt the treating composition to a liquid state with the molten composition being contained with its vapour in isolation in said second vessel until the operator opens said first valve to admit the liquid into the first vessel;
said shelf being mounted non-symmetrically in the first vessel such that when the vessel is partially filled with liquid, the assembly can be manipulated to alternately immerse the shelf and article in the liquid and withdraw the shelf and article from the liquid.

2. An apparatus according to claim 1 wherein said first and second vessels and said joining means include outwardly flared mating flanges, said flanges having mating faces including complimentary O-ring groover and said vessels and said vessels joining means are joined and sealed by means of an O-ring and said O-ring grooves and circumferential clamping rings extending circumferentially around said outwardly flared flanges, 3. An apparatus according to claim 2 wherein said first and second vessels are formed of pyrex glass.

* * * * *